United States Patent [19]
Palmer

[11] Patent Number: 5,691,569
[45] Date of Patent: Nov. 25, 1997

[54] INTEGRATED CIRCUIT PACKAGE THAT HAS A PLURALITY OF STAGGERED PINS

[75] Inventor: Mark J. Palmer, Phoenix, Ariz.

[73] Assignee: Intel Corporation, Santa Clara, Calif.

[21] Appl. No.: 575,498

[22] Filed: Dec. 20, 1995

[51] Int. Cl.$^6$ .............................. H01L 23/48; H01L 23/52
[52] U.S. Cl. ..................... 257/692; 257/697; 257/773; 361/772; 361/791
[58] Field of Search ........................... 257/692, 697, 257/786, 773; 361/772, 783, 791, 820

[56] References Cited

U.S. PATENT DOCUMENTS

| | | | |
|---|---|---|---|
| 4,254,445 | 3/1981 | Ho | 257/786 |
| 4,322,778 | 3/1982 | Barbour et al. | 257/697 |
| 4,338,621 | 7/1982 | Braun | 257/697 |
| 4,616,406 | 10/1986 | Brown | 257/697 |
| 4,930,002 | 5/1990 | Takenaka et al. | 257/697 |
| 4,942,453 | 7/1990 | Ishida et al. | 257/692 |
| 5,061,989 | 10/1991 | Yen et al. | 257/692 |
| 5,266,826 | 11/1993 | Umeyama | 257/786 |
| 5,490,040 | 2/1996 | Gavdenzi et al. | 257/697 |

*Primary Examiner*—Tom Thomas
*Assistant Examiner*—David Ostrowski
*Attorney, Agent, or Firm*—Blakely, Sokoloff, Taylor & Zafman

[57] ABSTRACT

A contact pattern for an integrated circuit package. The package has a plurality of contacts that are soldered to corresponding pads of a printed circuit board. The contacts are arranged into a plurality of cell units. Each cell unit has a row of center contacts diagonally located between two rows of outer contacts. The diagonally located pins increase the density of the contact pattern. Each unit cell is separated by a space that allows routing traces to be routed therethrough. Routing traces may also be routed through the unit cells to increase the routing density of the package. The package provides a contact pattern that optimizes both the pin density and the routing traces.

8 Claims, 2 Drawing Sheets

INTEGRATED CIRCUIT PACKAGE THAT HAS A PLURALITY OF STAGGERED PINS

BACKGROUND OF THE INVENTION

1. Field of the Invention

The present invention relates to a pin pattern for an integrated circuit package.

2. Description of Related Art

Integrated circuits are typically housed within a package that is mounted to a printed circuit board. The package has a plurality of contacts that are coupled to the integrated circuit and soldered to corresponding pads or plated through holes of the printed circuit board. The contacts carry power/ground and digital signals from the circuit board to the integrated circuit within the package. Highly functional integrated circuits such as microprocessors require a relatively large number of input/output (I/O) pins and power/ground pins to operate the device. To provide the maximum number of pins it is desirable to create a contact spatial arrangement which has an optimal density. Pin density must be balanced with manufacturing feasibility and dielectric spacing FIG. 1a shows a conventional linear contact arrangement which has a number of evenly spaced rows of contacts 2. Although the linear arrangement create adequate dielectric spacing, such a pattern does not provide an optimal contact density.

FIG. 1b shows a staggered contact arrangement which has a number of diagonally positioned contacts located between two rows of contacts 2. It is sometimes desirable to utilize the surface of the contacts 2 as an additional routing layer for the package to route the various digital signals of the integrated circuit. The routing traces can be routed between the contacts. Although the staggered pin arrangement provides an optimal contact density, the staggered pattern limits the number of routing traces that can be routed between the contacts. It would be desirable to provide a package which has optimal routing and contact density.

SUMMARY OF THE INVENTION

The present invention is a contact pattern for an integrated circuit package. The package has a plurality of contacts that are soldered to corresponding pads of a printed circuit board. The contacts are arranged into a plurality of cell units. Each cell unit has a row of center contacts diagonally located between two rows of outer contacts. The diagonally located pins increase the density of the contact pattern. Each unit cell is separated by a space that allows routing traces to be routed therethrough. Routing traces may also be routed through the unit cells to increase the routing density of the package. The package provides a contact pattern that optimizes both the pin density and the routing traces.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1A:
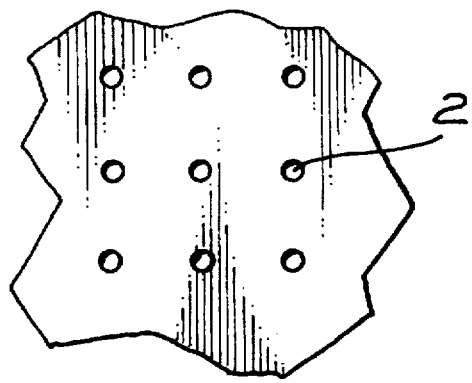
FIG. 1a is a top view of a linear contact pattern of the prior art.
Figure 1B:
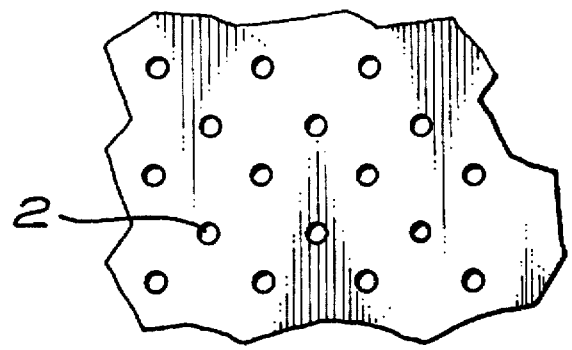
FIG. 1b is a top view of a staggered contact pattern of the prior art.
Figure 2:
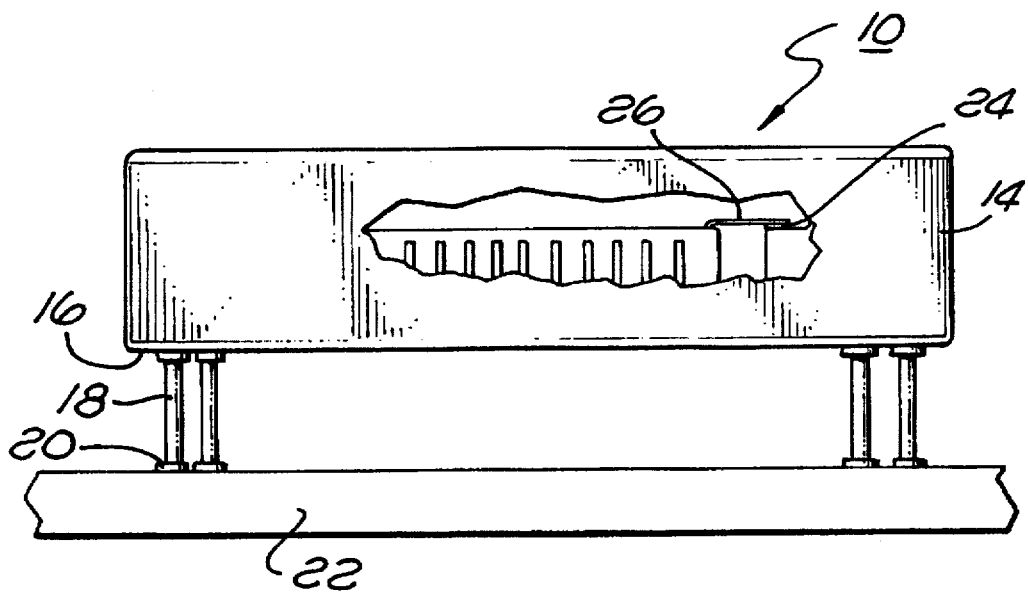
FIG. 2 is a cross-sectional view of an integrated circuit package of the present invention.

Referring to the drawings more particularly by reference numbers, FIG. 2 shows an integrated circuit package assembly 10 of the present invention. The assembly 10 includes an integrated circuit 12 mounted to a package 14. Located at a bottom surface 16 of the package 14 are a plurality of Contacts 18. The contacts 18 are soldered to corresponding surface pads 20 or plated through holes (not shown) of an external printed circuit board 22.

The contacts 18 are typically connected to internal routing (not shown) within the package 14. The internal routing may terminate at a plurality of bonding pads 24 that are connected to corresponding pads of the integrated circuit 12. The pads of the package 14 and integrated circuit 12 may be connected by bond wires 26 or other interconnect means such as tape automated bonding (TAB) tape (not shown).

The package 14 is typically constructed from a co-fired ceramic material which has a number of conductive layer, vias, bonding pads, etc. formed therein. Although a ceramic package is described, it is to be understood that the package 14 may be constructed from other material. By way of example, the contacts 18 may be connected to a substrate constructed from conventional printed circuit board processes. The integrated circuit may be mounted to the printed circuit board (not shown) and connected to routing within the board. Additionally, although an integrated circuit is shown and described, it is to be understood that the package 14 may house any passive or active discrete element.

The contacts 18 are preferably conductive pins that are attached to the package 14 and extend from the bottom surface 16. The pins 18 are preferably soldered to corresponding surface pads 28 located on the bottom surface of the package 14. Although pins 18 are shown and described, it is to be understood that the package may have other types of contacts, including but not limited to, solder balls that are typically used in ball grid array (BGA) packages, and surface mounted pads typically used in conventional ceramic packages.

Figure 3:
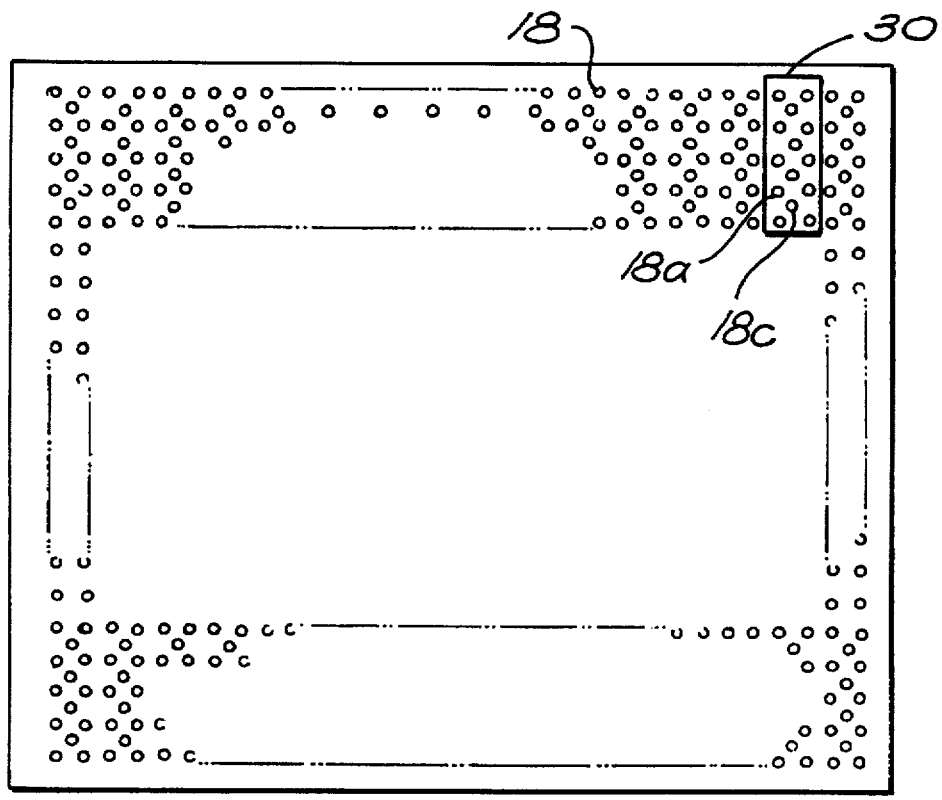
FIG. 3 is a bottom view of the integrated circuit package showing a contact pattern of the present invention.
Figure 4:
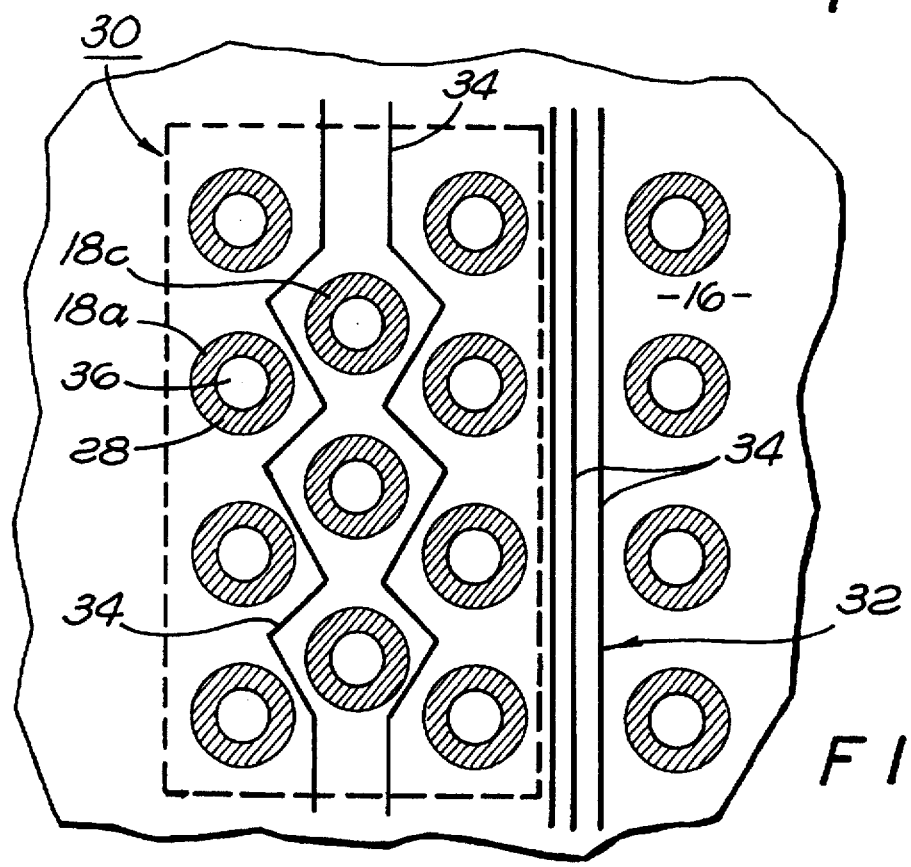
FIG. 4 is an enlarged bottom view of the contact pattern of the package.

FIGS. 3 and 4 show a contact pattern of the present invention. The contacts 18 are grouped into a plurality of unit cells 30. Each unit cell 30 has a row of center contacts 18c diagonally located between two outer rows of contacts 18a in a staggered pattern. The staggered pattern increases the pin density of the package. The external printed circuit board 22 also has a matching pattern of surface pads and/or plated through holes that are soldered to the contacts 18.

Each unit cell 30 is separated from another adjacent unit cell 30 by a space 32. Located within the spaces 32 are a plurality of routing traces 34 that extend across the bottom surface 16 of the package 14. Routing traces 34 may also be routed between the contacts 18 arranged in the staggered pattern.

The spaces 32 provide an additional area between the contacts 18 to allow a number of routing traces 34 to be routed along the bottom surface 16. By separating groups of staggered pin patterns with spaces 32, the contact arrangement of the present invention provide an optimal contact density while allowing a maximum number of routing traces to be routed across the bottom surface of the package.

In the preferred embodiment, the staggered pins in each unit cell have a pitch of approximately 0.075 inches. Each contact 18 is preferably constructed as a surface pad 28 which has a hole 38 that receives a pin. The surface pads 28 are preferably 0.052 inches in diameter with a hole diameter of 0.034 inches. The routing traces preferably have a line width of 0.006 inches. The unit cells 30 are preferably located in a rectangular pattern about the bottom surface 16 of the package.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electronic package, comprising:

a package which has a plurality of contacts that extend from an external surface of said package, said contacts are arranged into a plurality of unit cells wherein each unit cell is separated from an adjacent unit cell by a space, each unit cell has a rectangular pattern of four contacts and a center contact located in a center of said rectangular pattern, said external surface of said package further having a plurality of routing lines that extend along said space between said unit cells of contacts on said external surface of said package.

2. The package as recited in claim 1, wherein said routing lines extend through said rectangular pattern of contacts within said unit cells on said external surface of said package.

3. The package as recited in claim 1, wherein said contacts include a plurality of pins.

4. The package as recited in claim 1, wherein said unit cells are located within a rectangular pattern about said package.

5. An integrated circuit package, comprising:

a package which has a plurality of contacts, said contacts are arranged into a plurality of unit cells wherein each unit cell is separated from an adjacent unit cell by a space, each unit cell has a rectangular pattern of four contacts and a center contact located in a center of said rectangular pattern, said external surface of said package further having a plurality of routing lines that extend along said space between said unit cells of contacts on said external surface of said package; and, an integrated circuit that is mounted to said package and coupled to said contacts.

6. The package as recited in claim 5, wherein said routing lines extend through said rectangular pattern of contacts within said unit cells on said external surface of said package.

7. The package as recited in claim 5, wherein said contacts include a plurality of pins.

8. The package as recited in claim 5, wherein said unit cells are located within a rectangular pattern about said package.

* * * * *